United States Patent

Hu

[11] Patent Number: 5,960,862
[45] Date of Patent: Oct. 5, 1999

[54] CPU HEAT SINK MOUNTING STRUCTURE

[75] Inventor: Chin Yi Hu, Taipei, Taiwan

[73] Assignee: Tranyoung Technology Corp., Taipei, Taiwan

[21] Appl. No.: 08/918,645

[22] Filed: Aug. 22, 1997

[30] Foreign Application Priority Data

Aug. 29, 1996 [TW] Taiwan ................................. 85213295

[51] Int. Cl.$^6$ ............................................................ F28F 7/00
[52] U.S. Cl. ........................ 165/80.3; 165/121; 257/719; 257/718; 361/697
[58] Field of Search .................................... 165/80.3, 121, 165/185; 257/719, 718; 361/704, 703, 697, 710; 411/544, 353, 352, 153, 152

[56] References Cited

U.S. PATENT DOCUMENTS

| | | | |
|---|---|---|---|
| 2,201,930 | 5/1940 | Stark ................................... | 411/153 X |
| 2,593,064 | 4/1952 | Silberman .............................. | 411/352 |
| 3,843,080 | 10/1974 | Imai et al. .......................... | 411/352 X |
| 5,046,141 | 9/1991 | Walker ................................ | 411/352 X |
| 5,384,940 | 1/1995 | Soule et al. .......................... | 257/719 X |
| 5,396,402 | 3/1995 | Perugini et al. ....................... | 257/719 X |
| 5,542,468 | 8/1996 | Lin ..................................... | 257/719 X |
| 5,594,624 | 1/1997 | Clemens et al. ....................... | 361/704 |
| 5,602,719 | 2/1997 | Kinion ................................ | 257/719 X |
| 5,638,258 | 6/1997 | Lin ..................................... | 165/80.3 X |
| 5,654,876 | 8/1997 | Sathe et al. .......................... | 257/718 X |
| 5,664,624 | 9/1997 | Tsai et al. ............................. | 165/80.3 |
| 5,710,694 | 1/1998 | Chen ................................... | 361/703 |

*Primary Examiner*—Ira S. Lazarus
*Assistant Examiner*—Christopher Atkinson
*Attorney, Agent, or Firm*—Pro-Techtor International Services

[57] ABSTRACT

A CPU heat sink mounting structure including two heat sink fasteners fastened to a heat sink and a CPU holder at two opposite sides to hold them together, each heat sink fastener including a clamping plate having a vertical screw hole disposed in vertical alignment with a vertical through hole in a transverse channel at one side of the heat sink and a coupling hole disposed outside the heat sink and forced into engagement with a retainer block at one side of the CPU holder, a screw bolt slidably inserted into the vertical through of the transverse channel and threaded into the vertical screw hole of the clamping plate, and spring means mounted in the transverse channel of the heat sink and imparting an upward pressure to the clamping plate and the screw bolt.

4 Claims, 3 Drawing Sheets

CPU HEAT SINK MOUNTING STRUCTURE

BACKGROUND OF THE INVENTION

The present invention relates to a CPU heat sink mounting structure, and more specifically to a heat sink fastener used in a CPU heat sink mounting structure to secure a heat sink and a CPU holder firmly together.

FIGS. 1 and 2 show two CPU heat sink mounting structures according to the prior art, in which a curved steel wire rod 13 or substantially U-shaped clamping plate 14 is fastened to two retainer blocks 121' of a CPU holder 12' to hold down a heat sink 11, which carries a fan 10, permitting the heat sink 11 to be firmly retained in close contact with a CPU 20' in the CPU holder 12'. Because the curved steel wire rod 13 or U-shaped clamping plate 14 is simply bridged over the heat sink 11 to impart it with a downward pressure, the heat sink 11 tends to be forced by an external force to displace on the CPU 20' above the CPU holder 12'. Furthermore, the spring power of the curved steel wire rod 13 or U-shaped clamping plate 14 gradually reduces with use, causing it unable to firmly retain the heat sink 11 in place.

SUMMARY OF THE INVENTION

The present invention has been accomplished to provide a CPU heat sink mounting structure which eliminates the aforesaid drawbacks. According to the preferred embodiment of the present invention, two heat sink fasteners are installed to secure the heat sink and the CPU holder firmly together. Each heat sink fastener comprises a clamping plate having a vertical screw hole disposed in vertical alignment with a vertical through hole in a transverse channel at one side of the heat sink and a coupling hole disposed outside the heat sink and forced into engagement with a retainer block at one side of the CPU holder, a screw bolt slidably inserted into the vertical through hole of the transverse channel and threaded into the vertical screw hole of the clamping plate, and spring means mounted in the transverse channel of the heat sink and imparting an upward pressure to the clamping plate and the screw bolt.

DETAILED DESCRIPTION OF THE PREFERRED EMBODIMENT

Figure 1:
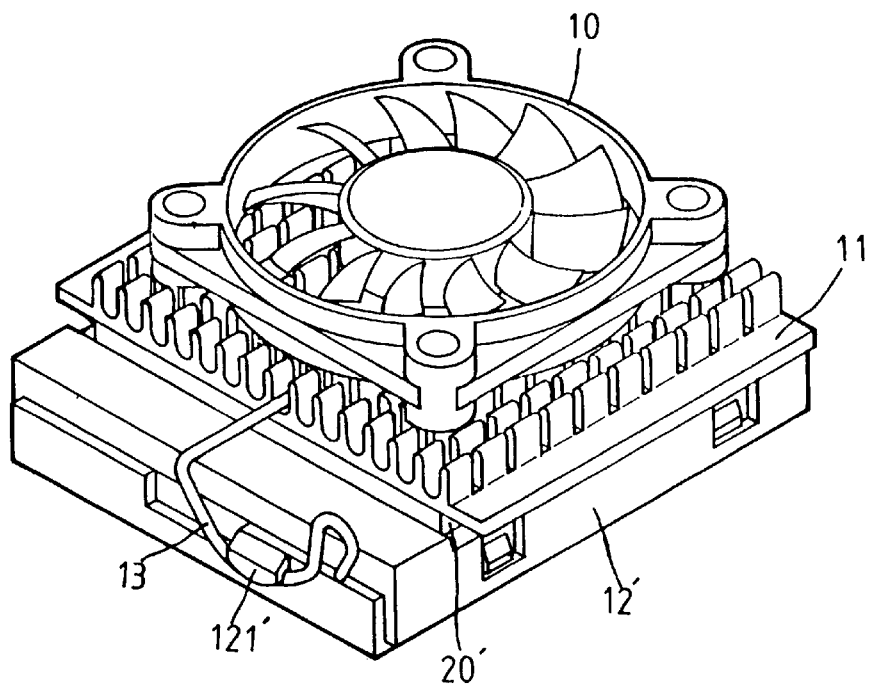
FIG. 1 is an elevational view of a CPU heat sink mounting structure according to the prior art.
Figure 2:
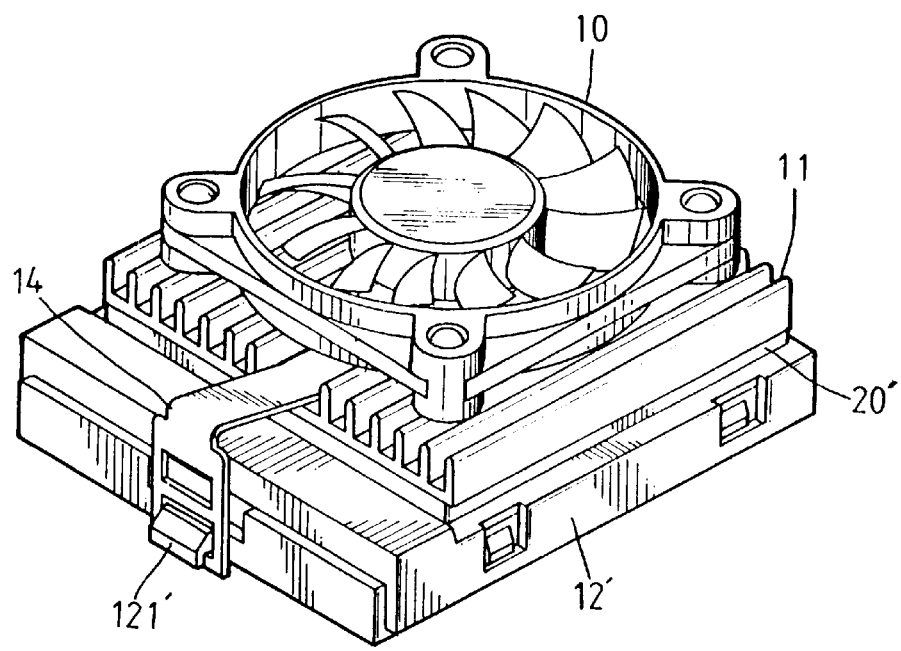
FIG. 2 is an elevational view of another arrangement of CPU heat sink mounting structure according to the prior art.
Figure 3:
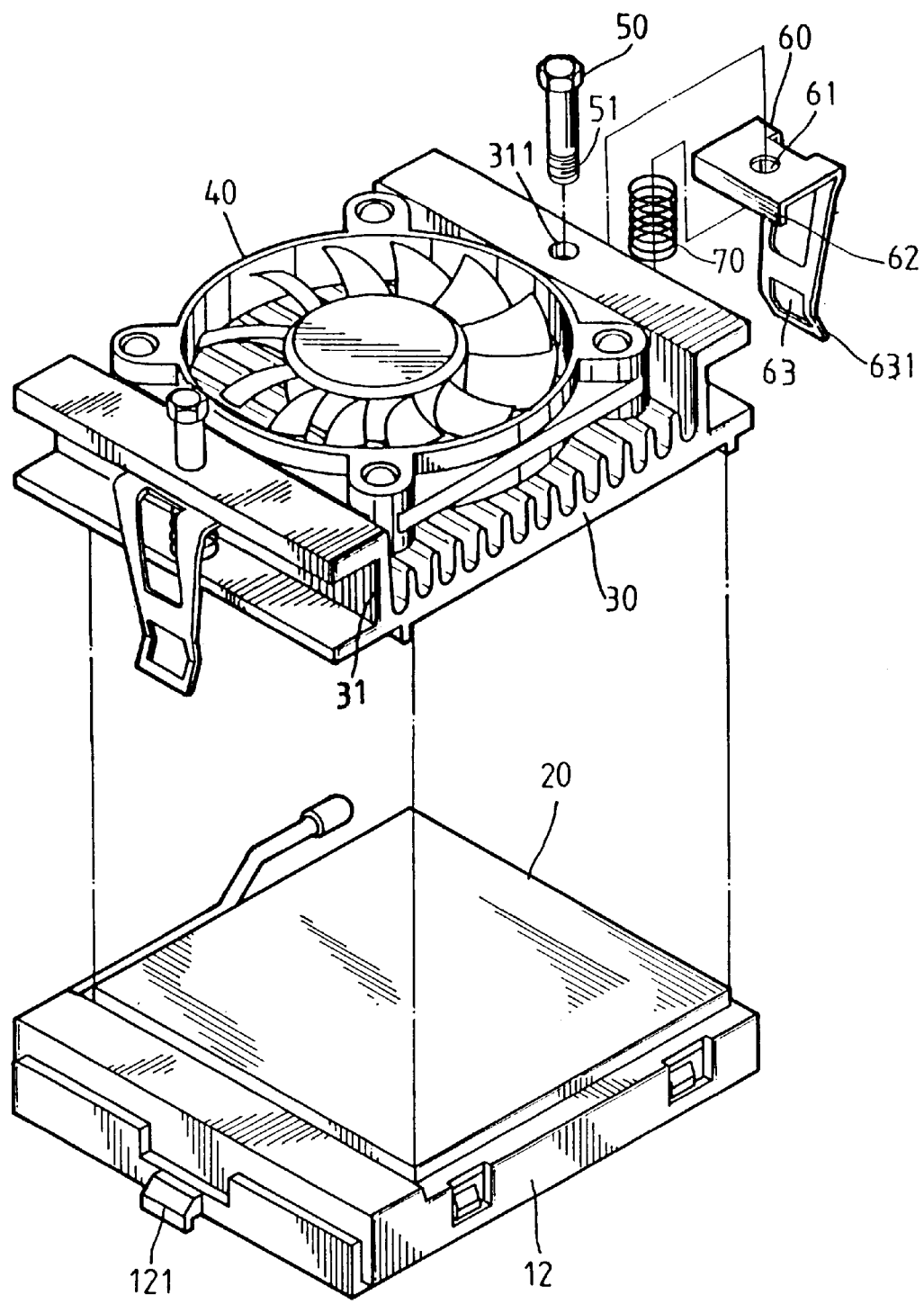
FIG. 3 is an exploded view of a CPU heat sink mounting structure according to the present invention.
Figure 4:
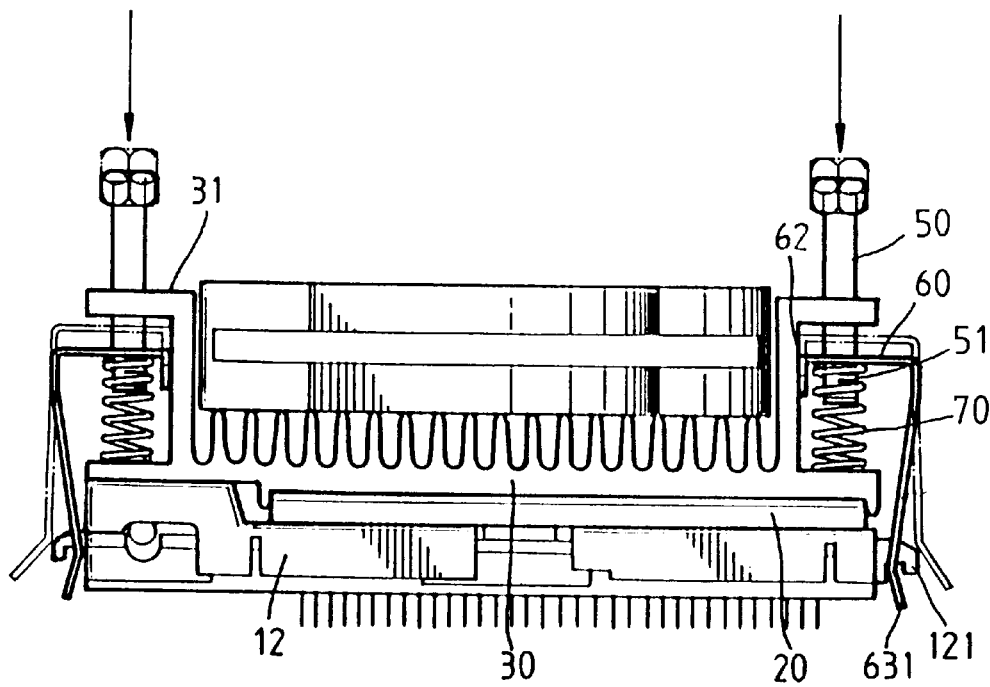
FIG. 4 is an installed view of the present invention, showing the screw bolts forced downwards, the clamping plates hooked on the retainer blocks of the CPU holder.
Figure 5:
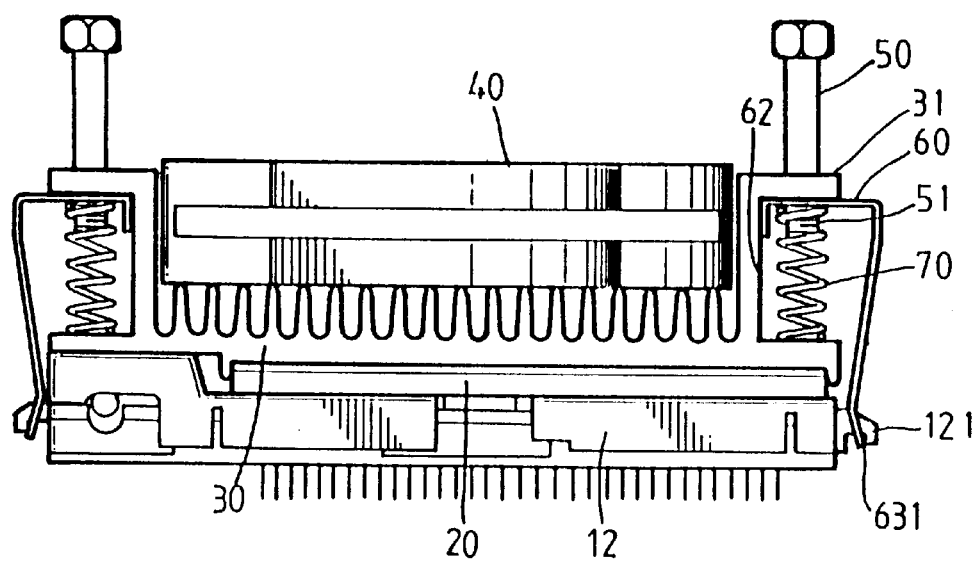
FIG. 5 is another installed view of the present invention, showing the clamping plates engaged with the retainer blocks of the CPU holder, the screw bolts moved to the upper limit position.

Referring to FIGS. 3, 4 and 5, a heat sink 30 is fastened to a CPU holder 12 to hold down a CPU 20, and a fan 40 is mounted on the heat sink 30 and controlled to cause currents of air for carrying heat away from the CPU 20 and the heat sink 30, and two heat sink fasteners are fastened to the heat sink 30 and the CPU holder 12 at two opposite sides to secure them together. The heat sink 30 has two transverse channels 31 respectively and reversely disposed at two opposite sides for mounting the heat sink fasteners, and two vertical through holes 311 respectively disposed at the top of the transverse channels 31 in the middle. The CPU holder 12 has two retainer blocks 121 raised from two opposite vertical side walls thereof corresponding to the transverse channels 31 of the heat sink 30.

Referring to FIG. 3 again, each heat sink fastener comprises a screw bolt 50, a substantially 7-shaped clamping plate 60, and a spring 70. The clamping plate 60 comprises a vertical front bumper 62, a top screw hole 61, a downwardly outwardly curved tail 631, and a coupling hole 63 at the tail 631.

Referring to FIGS. 4 and 5 again, the screw bolt 50 is inserted through the vertical through hole 311 of one transverse channel 31 of the heat sink 30 with its threaded rod 51 threaded into the screw hole 61 of the clamping plate 60, permitting the vertical front bumper 62 of the clamping plate 60 to be stopped at an inside vertical wall of the corresponding transverse channel 31 and the coupling hole 63 of the clamping plate 60 to be forced into engagement with the corresponding retainer block 121 of the CPU holder 12. The spring 70 is mounted within one transverse channel 31 of the heat sink 30 in a vertical position and supported between a horizontal bottom wall of the corresponding transverse channel 31 and a part of the clamping plate 60 to impart an upward pressure to the clamping plate 60. When the screw bolt 50 is forced downwards as shown in FIG. 4, the coupling hole 63 of the tail 631 of the clamping plate 60 can be conveniently forced into engagement with the corresponding retainer block 121 of the CPU holder 12. When the downward pressure is released from the screw bolt 50, the clamping plate 60 is forced upwards by the spring 70, and therefore the coupling hole 63 of the tail 631 of the clamping plate 60 is firmly retained in engagement with the corresponding retainer block 121 (see FIG. 5). If the screw bolt 50 is forced downwards again, the tail 631 of the clamping plate 60 can be conveniently disengaged from the corresponding retainer block 121, permitting the heat sink 30 to be detached from the CPU holder 12.

It is to be understood that the drawings are designed for purposes of illustration only, and are not intended as a definition of the limits and scope of the invention disclosed.

What the invention claimed is:

1. A CPU heat sink mounting structure comprising:
   a heat sink fastened to a CPU holder to carry a fan and to hold down a CPU in said CPU holder, and
   a first heat sink fastener fastened to said heat sink and a second heat sink fastener fastened to said CPU holder to secure said heat sink to said CPU holder, two retainer blocks are raised from two opposite vertical lateral sides of said CPU holder to receive said heat sink fasteners, wherein:
   said heat sink has a first transverse channel disposed at a first side thereof, and a second transverse channel disposed at a second side thereof, each said channel includes a though hole in a top side thereof;
   each said heat sink fastener comprises a clamping plate having a screw hole disposed in alignment with said through hole of the corresponding transverse channel, each said heat sink fastener further comprises a coupling hole disposed outside said heat sink, said coupling hole engages the corresponding retainer block of said CPU holder, a screw bolt is slidably inserted into the through hole of each said heat sink fastener and threaded into the screw hole of said clamping plate, and each said heat sink fastener further includes a spring means mounted in the corresponding transverse channel of said heat sink, said spring means imparts an upward pressure to said clamping plate and said screw bolt.

2. The CPU heat sink mounting structure of claim 1, wherein:

said clamping plate is shaped substantially like a "7" in side view.

3. The CPU heat sink mounting structure of claim 2, wherein:

each said clamping plate has a vertical front bumper that abuts a vertical inside wall of the corresponding transverse channel.

4. The CPU heat sink mounting structure of claim 2 wherein:

said clamping plate has an end piece extending downward and outwardy from its coupling hole.

* * * * *